US009856555B2

(12) United States Patent
Yamazaki et al.

(10) Patent No.: US 9,856,555 B2
(45) Date of Patent: *Jan. 2, 2018

(54) METHOD OF MANUFACTURING A LIGHT-EMITTING DEVICE (71) Applicant: Semiconductor Energy Laboratory Co., Ltd., Kanagawa-ken (JP)

(72) Inventors: Shunpei Yamazaki, Tokyo (JP); Takeshi Fukunaga, Kanagawa (JP)

(73) Assignee: Semiconductor Energy Laboratory Co., Ltd. (JP)

(*) Notice: Subject to any disclaimer, the term of this patent is extended or adjusted under 35 U.S.C. 154(b) by 0 days.

This patent is subject to a terminal disclaimer.

(21) Appl. No.: 15/418,091

(22) Filed: Jan. 27, 2017

(65) Prior Publication Data
US 2017/0137930 A1 May 18, 2017

Related U.S. Application Data (60) Continuation of application No. 14/633,750, filed on Feb. 27, 2015, now Pat. No. 9,559,302, which is a continuation of application No. 12/467,497, filed on May 18, 2009, now Pat. No. 8,968,823, which is a division of application No. 09/747,731, filed on Dec. 22, 2000, now Pat. No. 8,119,189.

(30) Foreign Application Priority Data

Dec. 27, 1999 (JP) .................................. 11-371349

(51) Int. Cl.
| B05D 5/06 | (2006.01) |
| C23C 16/04 | (2006.01) |
| H01L 51/00 | (2006.01) |
| C23C 14/04 | (2006.01) |
| C23C 14/24 | (2006.01) |
| C23C 14/56 | (2006.01) |
| C23C 14/28 | (2006.01) |
| C23C 14/22 | (2006.01) |
| B05D 5/12 | (2006.01) |
| B05D 1/40 | (2006.01) |
| B05D 1/32 | (2006.01) |
| C23C 14/26 | (2006.01) |
| H01L 51/50 | (2006.01) |
| H01L 51/56 | (2006.01) |

(52) U.S. Cl.
CPC .............. *C23C 14/28* (2013.01); *B05D 1/32* (2013.01); *B05D 1/40* (2013.01); *B05D 5/12* (2013.01); *C23C 14/04* (2013.01); *C23C 14/042* (2013.01); *C23C 14/044* (2013.01); *C23C 14/22* (2013.01); *C23C 14/24* (2013.01); *C23C 14/243* (2013.01); *C23C 14/26* (2013.01); *C23C 14/564* (2013.01); *H01L 51/0008* (2013.01); *H01L 51/0011* (2013.01); *H01L 51/5012* (2013.01); *H01L 51/56* (2013.01)

(58) Field of Classification Search
CPC ............. H01L 51/0011; H01L 51/0008; H01L 51/5012; C23C 14/04; C23C 14/042; C23C 14/22; C23C 14/243; C23C 14/26; B05D 1/32; B05D 1/40; B05D 5/12
USPC .... 427/64, 66, 69, 70, 157, 248.1, 250, 251, 427/255.5, 282, 286; 118/718, 720, 721, 118/726, 727, 728, 504, 505
See application file for complete search history.

(56) References Cited

U.S. PATENT DOCUMENTS

| 2,351,536 A | 6/1944 | Osterberg et al. |
| 2,435,997 A * | 2/1948 | Bennett ................... C23C 14/24 |
| | | 118/727 |
| 3,110,620 A | 11/1963 | Bertelsen |
| 3,235,647 A | 2/1966 | Hanks |
| 3,312,190 A | 4/1967 | Bradshaw |
| 3,420,977 A | 1/1969 | Hanks et al. |
| 3,543,717 A | 12/1970 | Adachi |
| 3,636,305 A | 1/1972 | Passmore |
| 3,710,072 A | 1/1973 | Shrader et al. |
| 3,756,193 A | 9/1973 | Carmichael et al. |
| 3,931,490 A * | 1/1976 | Grothe .................... C23C 14/30 |
| | | 118/726 |

(Continued)

FOREIGN PATENT DOCUMENTS

| DE | 28 34 806 A1 | 2/1980 |
| DE | 44 22 697 C1 | 1/1996 |

(Continued)

OTHER PUBLICATIONS

Tang, C.W. et al., "Organic Electroluminescent Diodes," Applied Physics Letters, Sep. 21, 1987, vol. 51, No. 12, pp. 913-915.
Van Slyke, S.A. et al., "Blue Organic Light Emitting Devices," Proceedings of the Electroluminescence Workshop, 1996, pp. 195-200.
Definition of "Elongated," *Merriam-Webster's Collegiate Dictionary*, Tenth Edition, 1998, p. 375, Merriam-Webster, publisher.
Fukuda, Y et al., "An Organic LED Display Exhibiting Pure RGB Colors," Synthetic Metals, 2000, vol. 111-112, pp. 1-6.
Slyke, S. et al., "Linear Source Deposition of Organic Layers for Full-Color OLED," SID Digest '02: SID International Symposium Digest of Technical Papers, 2002, vol. 33, pp. 886-889.

(Continued)

*Primary Examiner* — William Phillip Fletcher, III
(74) *Attorney, Agent, or Firm* — Husch Blackwell LLP (57) ABSTRACT

An apparatus for forming a film having high uniformity in its film thickness distribution is provided. An evaporation source is used in which an evaporation cell, or a plurality of evaporation cells, having a longitudinal direction is formed, and by moving the evaporation source in a direction perpendicular to the longitudinal direction of the evaporation source, a thin film is deposited on a substrate. By making the evaporation source longer, the uniformity of the film thickness distribution in the longitudinal direction is increased. The evaporation source is moved, film formation is performed over the entire substrate, and therefore the uniformity of the film thickness distribution over the entire substrate can be increased.

8 Claims, 7 Drawing Sheets

(56) References Cited

U.S. PATENT DOCUMENTS

| | | | |
|---|---|---|---|
| 3,931,789 A | 1/1976 | Kakei et al. | |
| 3,971,334 A | 7/1976 | Pundsack | |
| 4,023,523 A | 5/1977 | Ing | |
| 4,187,801 A | 2/1980 | Monk | |
| 4,225,805 A | 9/1980 | Smithgall et al. | |
| 4,233,937 A | 11/1980 | Steube | |
| 4,405,487 A | 9/1983 | Harrah et al. | |
| 4,446,357 A | 5/1984 | Barshter | |
| 4,469,719 A | 9/1984 | Martin | |
| 4,543,467 A | 9/1985 | Eisele et al. | |
| 4,592,306 A | 6/1986 | Gallego | |
| 4,596,735 A | 6/1986 | Noguchi et al. | |
| 4,602,192 A | 7/1986 | Nomura et al. | |
| 4,627,989 A * | 12/1986 | Feuerstein | H01J 37/302 |
| | | | 118/663 |
| 4,672,265 A | 6/1987 | Eguchi et al. | |
| 4,769,292 A | 9/1988 | Tang et al. | |
| 4,885,211 A | 12/1989 | Tang et al. | |
| 4,897,290 A | 1/1990 | Terasaka et al. | |
| 4,951,601 A | 8/1990 | Maydan et al. | |
| 5,111,022 A | 5/1992 | Harper et al. | |
| 5,167,984 A | 12/1992 | Melnyk et al. | |
| 5,190,590 A | 3/1993 | Suzuki et al. | |
| 5,258,325 A | 11/1993 | Spitzer et al. | |
| 5,259,881 A | 11/1993 | Edwards et al. | |
| 5,310,410 A | 5/1994 | Begin et al. | |
| 5,429,884 A | 7/1995 | Namiki et al. | |
| 5,512,320 A | 4/1996 | Turner et al. | |
| 5,534,314 A | 7/1996 | Wadley et al. | |
| 5,550,066 A | 8/1996 | Tang et al. | |
| 5,643,685 A | 7/1997 | Torikoshi | |
| 5,670,792 A | 9/1997 | Utsugi et al. | |
| 5,701,055 A | 12/1997 | Nagayama et al. | |
| 5,817,366 A * | 10/1998 | Arai | C23C 14/568 |
| | | | 118/50 |
| 5,844,363 A | 12/1998 | Gu et al. | |
| 5,902,688 A | 5/1999 | Antoniadis et al. | |
| 5,904,961 A | 5/1999 | Tang et al. | |
| 5,906,857 A | 5/1999 | Mckee et al. | |
| 5,921,836 A | 7/1999 | Nanto et al. | |
| 5,935,395 A | 8/1999 | Ouellet et al. | |
| 5,943,600 A | 8/1999 | Ngan et al. | |
| 5,945,967 A | 8/1999 | Rallison et al. | |
| 5,972,183 A | 10/1999 | Krueger et al. | |
| 5,993,614 A | 11/1999 | Nomura | |
| 6,001,413 A | 12/1999 | Matsuura et al. | |
| 6,011,904 A | 1/2000 | Mattord | |
| 6,023,308 A | 2/2000 | Takemura | |
| 6,049,167 A | 4/2000 | Onitsuka et al. | |
| 6,124,215 A | 9/2000 | Zheng | |
| 6,132,280 A | 10/2000 | Tanabe et al. | |
| 6,132,805 A | 10/2000 | Moslehi | |
| 6,149,392 A | 11/2000 | Conte | |
| 6,179,923 B1 | 1/2001 | Yamamoto et al. | |
| 6,237,529 B1 | 5/2001 | Spahn | |
| 6,244,212 B1 | 6/2001 | Takacs et al. | |
| 6,280,861 B1 | 8/2001 | Hosokawa et al. | |
| 6,294,892 B1 | 9/2001 | Utsugi et al. | |
| 6,296,894 B1 | 10/2001 | Tanabe et al. | |
| 6,299,746 B1 | 10/2001 | Conte et al. | |
| 6,319,321 B1 | 11/2001 | Hiraga et al. | |
| 6,326,726 B1 * | 12/2001 | Mizutani | H01L 27/3283 |
| | | | 313/500 |
| 6,333,065 B1 | 12/2001 | Arai et al. | |
| 6,337,105 B1 | 1/2002 | Kunieda et al. | |
| 6,340,501 B1 | 1/2002 | Kamiyama et al. | |
| 6,380,081 B1 | 4/2002 | Lee | |
| 6,403,392 B1 | 6/2002 | Burrows et al. | |
| 6,432,561 B1 | 8/2002 | Yamazaki | |
| 6,469,439 B2 | 10/2002 | Himeshima et al. | |
| 6,482,752 B1 | 11/2002 | Yamazaki et al. | |
| 6,482,852 B2 | 11/2002 | Shakespeare et al. | |
| 6,495,198 B2 | 12/2002 | Peng | |
| 6,528,108 B1 | 3/2003 | Kawamura | |
| 6,537,607 B1 | 3/2003 | Swanson | |
| 6,633,121 B2 | 10/2003 | Eida et al. | |
| 6,641,674 B2 | 11/2003 | Peng | |
| 6,649,210 B2 | 11/2003 | Tokailin et al. | |
| 6,660,409 B1 | 12/2003 | Komatsu et al. | |
| 6,673,262 B1 | 1/2004 | Mori et al. | |
| 6,696,096 B2 | 2/2004 | Tsubaki et al. | |
| 6,776,880 B1 | 8/2004 | Yamazaki | |
| 7,168,436 B2 | 1/2007 | Mouri et al. | |
| 7,744,769 B2 | 6/2010 | Mouri et al. | |
| 8,119,189 B2 * | 2/2012 | Yamazaki | C23C 14/044 |
| | | | 427/255.5 |
| 8,968,823 B2 * | 3/2015 | Yamazaki | C23C 14/044 |
| | | | 427/255.5 |
| 9,559,302 B2 * | 1/2017 | Yamazaki | C23C 14/044 |
| 2001/0009154 A1 | 7/2001 | Nguyen et al. | |
| 2001/0022272 A1 | 9/2001 | Plester et al. | |
| 2002/0009538 A1 | 1/2002 | Arai | |
| 2002/0011205 A1 | 1/2002 | Yamazaki et al. | |
| 2002/0076847 A1 | 6/2002 | Yamada et al. | |
| 2002/0081372 A1 | 6/2002 | Peng | |
| 2002/1008403 | 7/2002 | Jeng et al. | |
| 2002/0155632 A1 | 10/2002 | Yamazaki et al. | |
| 2002/0179013 A1 | 12/2002 | Kido et al. | |
| 2002/0192499 A1 | 12/2002 | Tokailin et al. | |
| 2002/0197418 A1 | 12/2002 | Mizukami et al. | |
| 2002/0197760 A1 | 12/2002 | Yamazaki et al. | |
| 2003/0015140 A1 | 1/2003 | Van Slyke et al. | |
| 2003/0017259 A1 | 1/2003 | Yamada et al. | |
| 2003/0024479 A1 | 2/2003 | Kashiwaya et al. | |
| 2003/0101937 A1 | 6/2003 | Van Slyke et al. | |
| 2004/1003536 | 2/2004 | Keum et al. | |
| 2004/1009669 | 5/2004 | Tokailin et al. | |
| 2004/0139984 A1 | 7/2004 | Yamazaki et al. | |
| 2005/0005850 A1 | 1/2005 | Yamazaki | |

FOREIGN PATENT DOCUMENTS

| | | |
|---|---|---|
| EP | 0 489 443 A1 | 6/1992 |
| EP | 0 865 229 A2 | 9/1998 |
| EP | 0 924 282 A1 | 6/1999 |
| EP | 0 955 791 A1 | 11/1999 |
| JP | 54-127877 A | 10/1979 |
| JP | 57-123973 A | 8/1982 |
| JP | 57-172060 | 10/1982 |
| JP | 58-177463 A | 10/1983 |
| JP | 60-032361 | 3/1985 |
| JP | 60-121616 A | 6/1985 |
| JP | 63-079959 A | 4/1988 |
| JP | 63-186763 | 11/1988 |
| JP | 63-297549 A | 12/1988 |
| JP | 64-042392 A | 2/1989 |
| JP | 02-173261 A | 7/1990 |
| JP | 03-232962 A | 10/1991 |
| JP | 04-116169 A | 4/1992 |
| JP | 04-268068 A | 9/1992 |
| JP | 04-272170 A | 9/1992 |
| JP | 05-304197 A | 11/1993 |
| JP | 06-088233 A | 3/1994 |
| JP | 06-212425 A | 8/1994 |
| JP | 06-256936 A | 9/1994 |
| JP | 06-306181 A | 11/1994 |
| JP | 07-176264 A | 7/1995 |
| JP | 07-192866 A | 7/1995 |
| JP | 07-216539 A | 8/1995 |
| JP | 07-252671 A | 10/1995 |
| JP | 08-111285 A | 4/1996 |
| JP | 09-016960 A | 1/1997 |
| JP | 09-209127 A | 8/1997 |
| JP | 09-256142 A | 9/1997 |
| JP | 10-041069 A | 2/1998 |
| JP | 10-050478 A | 2/1998 |
| JP | 10-162954 A | 6/1998 |
| JP | 10-168559 A | 6/1998 |
| JP | 10-195639 A | 7/1998 |
| JP | 10-214682 A | 8/1998 |
| JP | 10-255973 A | 9/1998 |
| JP | 10-270164 A | 10/1998 |
| JP | 10-317139 A | 12/1998 |
| JP | 10-335062 A | 12/1998 |

(56) References Cited

FOREIGN PATENT DOCUMENTS

| | | |
|---|---|---|
| JP | 11-061386 A | 3/1999 |
| JP | 11-158605 A | 6/1999 |
| JP | 11-189865 A | 7/1999 |
| JP | 11-229123 A | 8/1999 |
| JP | 11-236561 A | 8/1999 |
| JP | 2000-348859 A | 12/2000 |
| JP | 2001-093667 A | 4/2001 |
| JP | 2002-075638 A | 3/2002 |
| JP | 2002-105622 A | 4/2002 |
| WO | WO 98/54375 A1 | 12/1998 |
| WO | WO 01/31081 A1 | 5/2001 |
| WO | WO 01/79581 A1 | 10/2001 |

OTHER PUBLICATIONS

Serach Report re European Application No. EP 00128521.2, dated Oct. 9, 2003.
Document Submitted in Japanese Patent Application No. JP 2000-394259, dated Mar. 24, 2005.
Japanese Patent Office Notification re Japanese Patent Application No. JP 2000-394259, dated May 30, 2005.
Japanese Office Action re Application No. JP 2000-394259, dated May 9, 2006.
European Office Action re Application No. EP 00128521.2, dated Sep. 4, 2013.
"Oxford English Dictionary | The definitive record of the English language," http://oed.com/view/entry/96066?rskey=i0fvj6&result=2&isAdvanced=false&print, Oct. 19, 2014, p. 3 pages.
Japanese Office Action re Application No. JP 2013-156332, dated Sep. 2, 2014.

\* cited by examiner

FIG. 8 ial which flies off in a radial shape from one evaporation
METHOD OF MANUFACTURING A LIGHT-EMITTING DEVICE The present application is a continuation of U.S. application Ser. No. 14/633,750, filed Feb. 27, 2015 (now U.S. Pat. No. 9,559,302 issued Jan. 31, 2017) which is a continuation of U.S. application Ser. No. 12/467,497, filed May 18, 2009 (now U.S. Pat. No. 8,968,823 issued Mar. 3, 2015) which is a divisional of U.S. application Ser. No. 09/747,731, filed Dec. 22, 2000 (now U.S. Pat. No. 8,119,189 issued Feb. 21, 2012), which are all incorporated herein by reference.

BACKGROUND OF THE INVENTION

1. Field of the Invention

The present invention relates to an apparatus or a method for forming a film used in manufacturing an EL (electroluminescence) element having a structure composed of an anode, a cathode, and sandwiching between the anode and the cathode a light emitting material, in particular a self-luminescing organic material (hereafter referred to as an organic EL material), from which EL (Electro Luminescence) is obtained.

2. Description of the Related Art

There are two types of EL display devices, a passive (a simple matrix), and an active (an active matrix), and development of both is being enthusiastically performed. In particular, active matrix EL display devices are in the spotlight at present. Furthermore, organic materials and inorganic materials exist for an EL material which becomes a light emitting layer of an EL element, and in addition organic materials are divided into low molecular weight (monomer) organic EL materials and high molecular weight (polymer) organic EL materials. Both are being vigorously researched, but a film of a low molecular weight organic EL material is mainly formed by evaporation, while a film of a high polymer organic EL material is mainly formed by application.

In order to manufacture a color display EL display device, it is necessary to form films of EL materials which emit different colors, for each pixel. However, in general EL materials are weak with respect to water and oxygen, and patterning by photolithography cannot be performed. It is therefore necessary to form the films at the same time as patterning.

The most general method is a method for forming a mask, made from a metallic plate or a glass plate and having an open portion formed in it, between the substrate onto which a film is formed and an evaporation source. In this case, the vaporized EL material from the evaporation source passes through only the open portion to thereby form the film selectively, and therefore it is possible to form an EL layer in which film formation and patterning are performed simultaneously.

With a conventional evaporation apparatus, the EL material which flies off in a radial shape from one evaporation source accumulates on a substrate, forming a thin film, and therefore, considering the distance that the EL material covers, a way of substrate positioning was devised. For example, a method of fixing a substrate to a circular cone shaped substrate holder, making the distances from the evaporation source to the substrate all equal, is performed.

However, when employing a multi-beveling process in which a plurality of panels are manufactured on a large size substrate, the substrate holder becomes extremely large if the above stated process is performed, and this leads to the main body of the film formation apparatus becoming large. Further, the substrate is planar when performing by single wafer processing as well, and therefore the distances from the evaporation source differs within the surface of the substrate, and a problem remains in that it is difficult to deposit at a uniform film thickness.

In addition, if the distance between the evaporation source and the shadow mask is not made longer when using a large size substrate, the vaporized EL material does not sufficiently spread, and it becomes difficult to form a uniform thin film over the entire substrate surface. Maintaining this distance also encourages making the apparatus large size.

SUMMARY OF THE INVENTION

The present invention is made in view of the above stated problems, and an object of the present invention is to provide a film formation apparatus capable of forming a thin film having a highly uniform film thickness distribution at high throughput. Further, an object of the present invention is to provide a method of forming a film using the film formation apparatus of the present invention.

An evaporation source in which an evaporation cell having a longitudinal direction (a portion in which a thin film material for evaporation is placed), or a plurality of the evaporation cells, are formed is used in the present invention. By moving the evaporation source in a direction perpendicular to the longitudinal direction of the evaporation source, a thin film is formed. Note that, "having a longitudinal direction" indicates a long and thin rectangular shape, a long and thin elliptical shape, or a linear shape. It is preferable that the length in the longitudinal direction be longer than the length of one side of a substrate for the present invention because processing can be performed in one sweep. Specifically, the length may be from 300 mm to 1200 mm (typically between 600 and 800 mm).

Figures 1A, 1C:
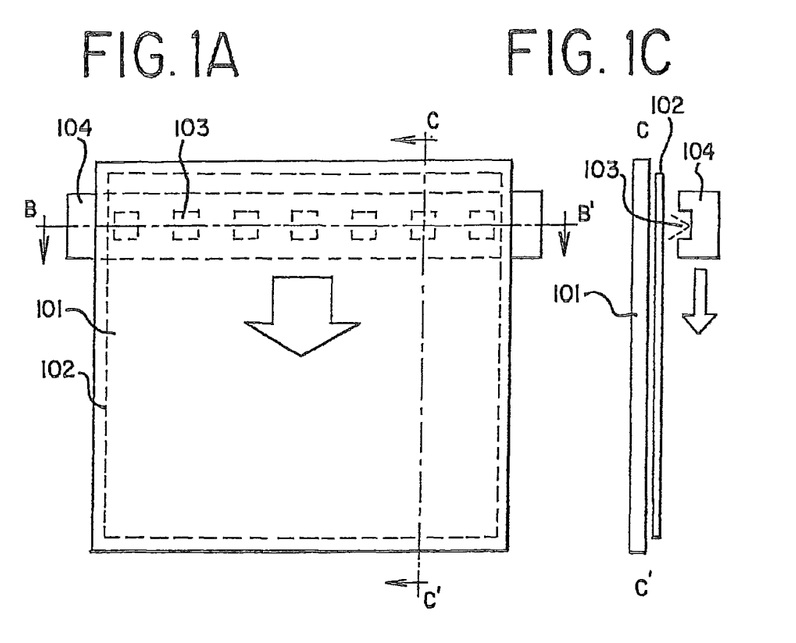
FIGS. 1A to 1C are diagrams showing a structure of an evaporation source.
Figure 1B:
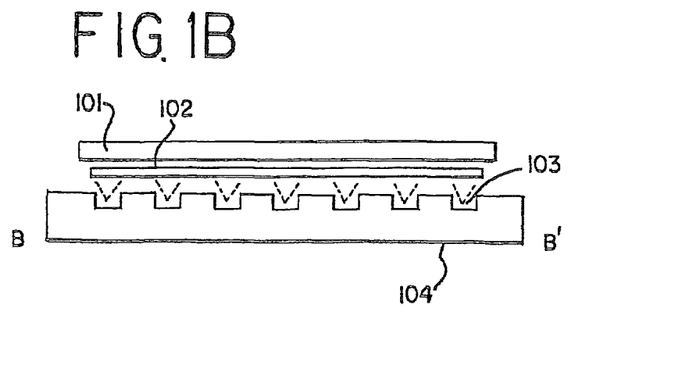

The positional relationship between the evaporation source of the present invention and the substrate is shown in FIGS. 1A to 1C. FIG. 1A is a top view, FIG. 1B is a cross sectional diagram of FIG. 1A cut along the line segment B-B', and FIG. 1C is a cross sectional diagram of FIG. 1A cut along the line segment C-C'. Note that, common symbols are used in FIGS. 1A to 1C.

As shown in FIG. 1A, a shadow mask 102 is placed below a substrate 101, and in addition, a rectangular shaped evaporation source 104, in which a plurality of evaporation cells 103 are lined up on a straight line, is placed below the shadow mask 102. Note that, throughout this specification, the term substrate includes a substrate and thin films formed on that substrate. Further, the term substrate surface indicates the substrate surface on which the thin films are formed.

The length of the longitudinal direction of the evaporation source 104 is longer than the length of one side of the substrate 101, and a mechanism for moving the evaporation source 104 in a direction shown by an arrow (a direction perpendicular to the longitudinal direction of the evaporation source 104) is prepared. By then moving the evaporation source 104, a thin film can be formed over the entire surface of the substrate. Note that, when the length of the longitudinal direction is shorter than that of one side of the substrate, the thin film may be formed by repeating a plurality of scans. Furthermore, a lamination of the same thin film may be formed by repeatedly moving the evaporation source 104.

The thin film material vaporized by each of the evaporation cells 103 is scattered in the upward direction, passes through open portions (not shown in the figures) formed in the shadow mask 102, and accumulates on the substrate 101. The thin film is thus selectively deposited on the substrate 101. A region in which the thin film material scattered from one evaporation cell 103 forms a film overlaps with a region in which the thin film material scattered from an adjoining evaporation cell 103 forms a film. By mutually overlapping the regions in which the film is deposited, the film is formed in a rectangular shape region.

The uniformity in film thickness of a thin film can thus be greatly improved with the present invention by using the evaporation source having a plurality of evaporation cells lined up, and by irradiating from a line instead of conventional irradiation from a point. In addition, by moving the rectangular shape evaporation source below the substrate surface, film formation can be performed at high throughput.

Additionally, it is not necessary to make the distance between the evaporation source 104 and the shadow mask 102 longer with the present invention, and evaporation can be performed in a state of extreme closeness. This is because a plurality of evaporation cells are formed in alignment, and even if the scattering distance of the thin film material is short, film formation can be performed simultaneously from the central portion to the edge portion of the substrate. This effect is greater the higher the density at which the evaporation cells 103 are lined up.

The distance from the evaporation source 104 to the shadow mask 102 is not particularly limited because it differs depending upon the density at which the evaporation cells 103 are formed. However, if it is too close, then it becomes difficult to form a uniform film from the center portion to the edge portion, and if it is too far, there will be no change from conventional evaporation by irradiating from a point. Therefore, if the gap between evaporation cells 103 is taken as "a", it is preferable to make the distance between the evaporation source 104 and the shadow mask 102 from 2a to 100a (more preferably from 5a to 50a).

With the film formation apparatus of the present invention structured as above, uniformity of the distribution of film thickness of a thin film in a rectangular shape, elliptical shape, or a linear shape region is maintained by using the evaporation source, and by moving the evaporation source on top of that region, it becomes possible to form a thin film having high uniformity over the entire surface of the substrate. Further, this is not evaporation from a point, and therefore the distance between the evaporation source and the substrate can be made shorter, and the uniformity of film thickness can be further increased.

Furthermore, it is effective to add means for generating a plasma within a chamber in the film formation apparatus of the present invention. By performing a plasma process in accordance with oxygen gas or a plasma process in accordance with a gas containing fluorine, thin films deposited on the chamber walls are removed, and cleaning of the inside of the chamber can be performed. Parallel-plate electrodes may be formed within the chamber, and a plasma may be generated between the plates as the means for generating the plasma.

BRIEF DESCRIPTION OF THE DRAWINGS

In the accompanying drawings.

DETAILED DESCRIPTION OF THE PREFERRED EMBODIMENTS

Embodiment Mode

Figure 2A:
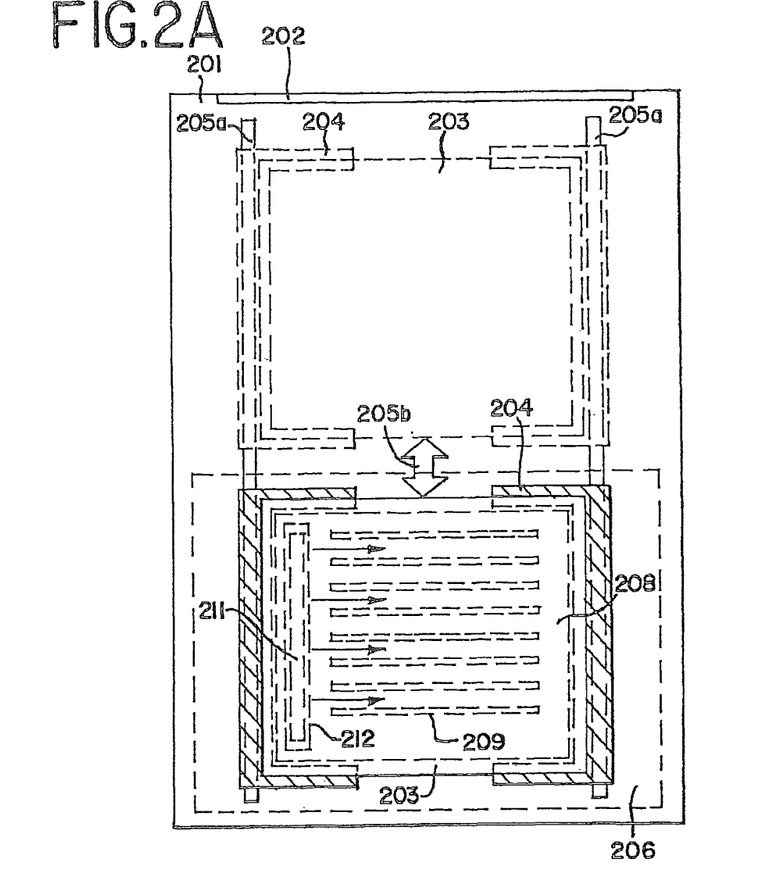
FIGS. 2A and 2B are diagrams showing a structure of an evaporation chamber.
Figure 2B:
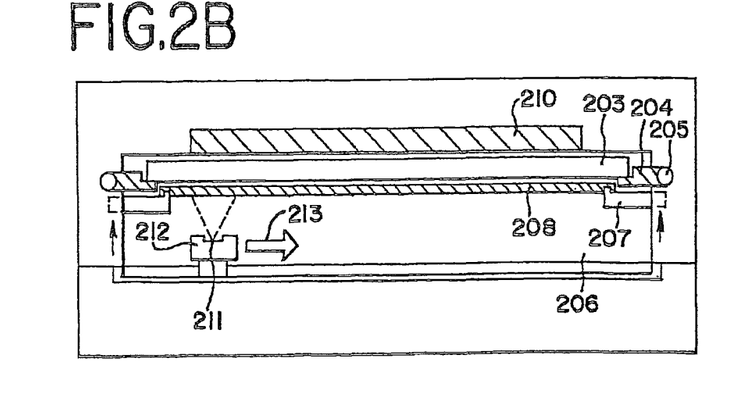

A structure of an evaporation chamber prepared in a film formation apparatus of the present invention is shown in FIGS. 2A and 2B. FIG. 2A is a top view of the evaporation chamber, and FIG. 2B is a cross sectional diagram. Note that common symbols are used for common portions. Further, an example of forming an EL (electroluminescence) film as a thin film is shown in the embodiment mode.

In FIG. 2A, reference numeral 201 denotes a chamber, and reference numeral 202 denotes a substrate conveyor opening, from which a substrate is conveyed to the inside portion of the chamber 201. A conveyed substrate 203 is set in a substrate holder 204, and is conveyed in to a film formation portion 206 by a conveyor rail 205a, as shown by an arrow 205b.

When the substrate 203 is conveyed to a film formation portion 206, a shadow mask 208 fixed to a mask holder 207 approaches the substrate 203. Note that, a metallic plate is used as the material of the shadow mask 208 in this embodiment mode. (See FIG. 2B) Further, open portions 209 are formed having a rectangular shape, elliptical shape, or linear shape in the shadow mask 208 in this embodiment mode. The shape of the opening portions is not limited, of course, and a matrix shape or a net shape may also be formed.

Figure 3:
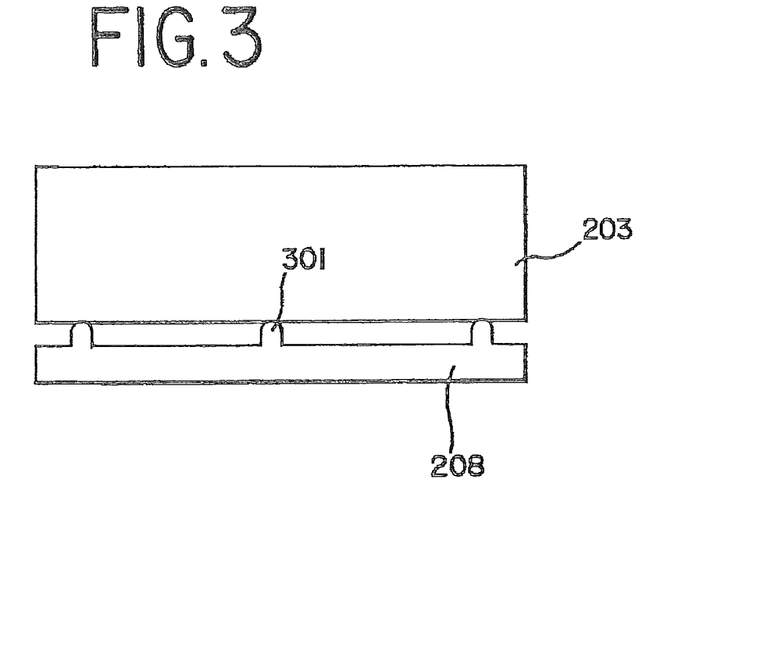
FIG. 3 is a diagram showing a structure of an evaporation chamber.

At this point in the embodiment mode, this is a structure in which an electromagnet 210 approaches the substrate 203, as shown in FIG. 2B. When a magnetic field is formed by the electromagnet 210, the shadow mask 208 is drawn to the substrate 203, and is maintained at a predetermined gap. This gap is secured by a plurality of projections 301 formed in the shadow mask 208, as shown in FIG. 3.

Figure 4:
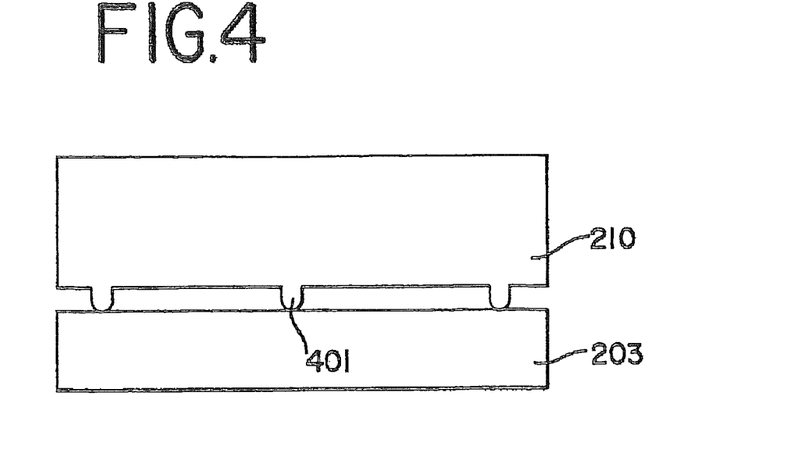
FIG. 4 is a diagram showing a structure of a film formation apparatus.

This type of structure is particularly effective when the substrate 203 is a large size substrate exceeding 300 mm. If the substrate 203 is large size, then deflection (warp) is generated by the weight of the substrate itself. However, the substrate 203 can also be pulled toward the electromagnet 210 and the flexure can be canceled provided that the shadow mask 208 is drawn toward the substrate 203 side by the electromagnet 210. Note that, as shown in FIG. 4, it is preferable to form projections 401 in the electromagnet 210, and to maintain a gap between the substrate 203 and the electromagnet 210.

When the gap between the substrate 203 and the shadow mask 208 is secured, an evaporation source 212, on which evaporation cells 211 having a longitudinal direction are formed, is then moved in the direction of the arrow 213. An EL material formed in the inside portion of the evaporation cells is vaporized by being heated while being moved, and is scattered within the chamber of the film formation portion 206. Note that the distance between the evaporation source 212 and the substrate 203 can be made extremely short for the case of the present invention, and therefore adhesion of the EL material to a drive portion (a portion for driving the evaporation source, the substrate holder, or the mask holder) within the chamber can be minimized.

The evaporation source 212 is scanned from one end of the substrate 203 to the other end. As shown in FIG. 2A, the length of the longitudinal direction of the evaporation source 212 is sufficiently long in the embodiment mode, and therefore it can be moved over the entire surface of the substrate 203 by scanning once.

After a film is formed from a red, green, or blue color EL material (red here) as above, the magnetic field of the electromagnet 210 is switched off, the mask holder 207 is dropped down, and the distance between the shadow mask 208 and the substrate 203 increases. The substrate holder 204 is then shifted over by one pixel portion, the mask holder 207 is raised again, and the shadow mask 208 and the substrate 203 are made to come closer. In addition, a magnetic field is formed by the electromagnet 210, and deflection (warp) of the shadow mask 208 and the substrate 203 is eliminated. The evaporation cell is changed next, and film formation of a red, green, or blue EL material (green here) is performed.

Note that, a structure in which the substrate holder 204 is shifted by one pixel portion is shown here, but the mask holder 204 may also be shifted by one pixel portion.

After all film formation of red, green, and blue EL materials by this type of repetition, the substrate 203 is lastly conveyed to the substrate conveyor opening 202, and is removed from the chamber 201 by a robot arm (not shown in the figures). Film formation of the EL films using the present invention is thus completed.

Embodiment 1

Figure 5:
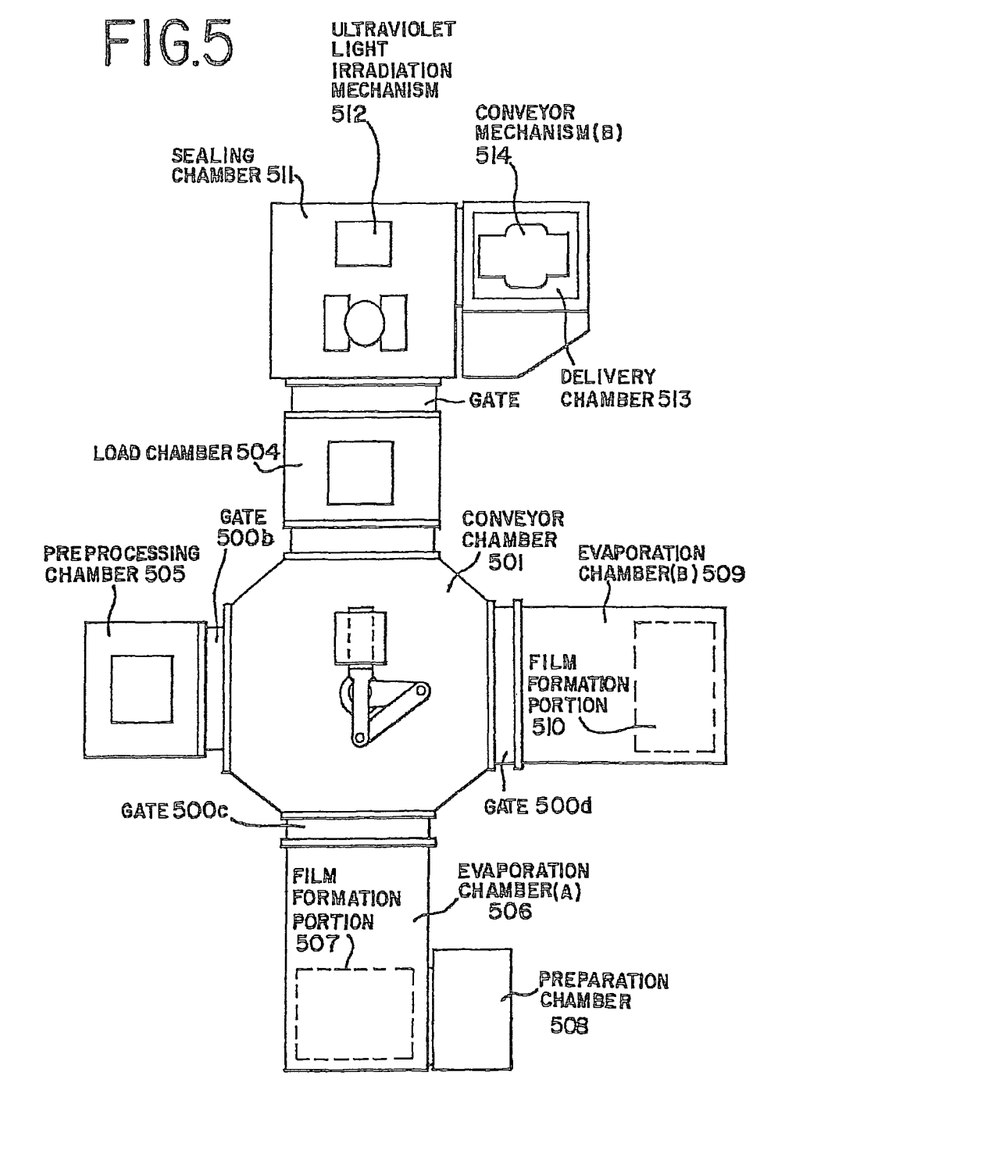
FIG. 5 is a diagram showing a structure of a film formation apparatus.

An explanation of a film formation apparatus of the present invention is explained using FIG. 5. In FIG. 5, reference numeral 501 denotes a conveyor chamber. A conveyor mechanism 502 is prepared in the conveyor chamber 501, and conveyance of a substrate 503 is performed. The conveyor chamber 501 has a reduced pressure atmosphere, and is connected to each processing chamber by a gate. Delivery of the substrate to each processing chamber is performed by the conveyor mechanism 502 when the gates are open. Further, it is possible to use an evacuation pump such as an oil-sealed rotary pump, a mechanical booster pump, a turbo-molecular pump, and a cryo-pump in lowering the pressure of the conveyor chamber 501, but a cryo-pump, which is effective in removing moisture, is preferable.

An explanation regarding each processing chamber is made below. Note that the conveyor chamber 501 has a reduced pressure atmosphere, and therefore an evacuation pump (not shown in the figure) is prepared in each processing chamber directly connected to the conveyor chamber 501. The above stated oil-sealed rotary pump, mechanical booster pump, turbo-molecular pump, and cryo-pump are used as the evacuation pump.

First, reference numeral 504 denotes a load chamber for performing substrate setting, and it is also an unload chamber. The load chamber 504 is connected to the conveyor chamber 501 by a gate 500a, and a carrier (not shown in the figure) on which the substrate 503 is set is arranged here. Note that the load chamber 504 may also be separated into a substrate loading chamber and a substrate unloading chamber. Further, the above evacuation pump and a purge line for introducing high purity nitrogen gas or noble gas are prepared for the load chamber 504.

Note that a substrate on which process through the formation of a transparent conducting film, which becomes an anode of an EL element has been conducted, is used as the substrate 503 in Embodiment 1. The substrate 503 is set in the carrier with the surface on which the films are formed facing downward. This is in order to make a face-down method (also referred to as a deposition-up method) easier to perform when later performing film formation by evaporation. The face down method denotes a method in which film formation is performed with the substrate surface onto which a film is to be formed facing downward, and adhesion of refuse (dirt) or the like can be suppressed by this method.

Next, reference numeral 505 denotes a processing chamber for processing a surface of an anode or a cathode of an EL element (in Embodiment 1, an anode), and the processing chamber 505 is connected to the conveyor chamber 501 by a gate 500b. The processing chamber can be changed variously depending upon the manufacturing process of the EL element, and in Embodiment 1 heat treatment of the surface of the anode made from the transparent conducting film can be performed at between 100 and 120° C. in oxygen while irradiating ultraviolet light. This type of pre-process is effective when processing the anode surface of the EL element.

Next, reference numeral 506 denotes an evaporation chamber for film deposition of an organic EL material by evaporation, and is referred to as an evaporation chamber (A). The evaporation chamber (A) 506 is connected to the conveyor chamber 501 through a gate 500c. In Embodiment 1 an evaporation chamber having the structure shown in FIGS. 2A and 2B is used as the evaporation chamber (A) 506.

In a film formation portion 507 of the evaporation chamber (A) 506, first a hole injecting layer is deposited over the entire substrate surface, then a light emitting layer for emitting red color light is formed, next a light emitting layer for emitting green color light is formed, and lastly a light emitting layer for emitting blue color light is formed. Note that any known materials may be used as the hole injecting layer, the red color light emitting layer, the green color light emitting layer, and the blue color light emitting layer.

The evaporation chamber (A) 506 has a structure which is capable of switching in correspondence with the type of organic material of the film formation evaporation source. Namely, a preparation chamber 508 for storing a plurality of types of evaporation sources is connected to the evaporation chamber (A) 506, and evaporation source switching is performed by an internal conveyor mechanism. The evaporation source therefore changes when the organic EL material for film formation changes. Further, the same mask of shadow mask is moved by one pixel portion whenever the organic EL material for film formation is switched.

Note that FIGS. 2A and 2B may be referred to regarding film formation processes occurring within the evaporation chamber (A) 506.

Next, reference numeral 509 denotes an evaporation chamber for film formation of a conducting film (a metallic film which becomes a cathode is used in Embodiment 1), which becomes an anode or a cathode of the EL element, by evaporation, and is referred to as an evaporation chamber (B). The evaporation chamber (B) 509 is connected to the conveyor chamber 501 through a gate 500*d*. An evaporation chamber having the structure shown in FIGS. 2A and 2B is used as the evaporation chamber (B) 509 in Embodiment 1. In a film formation portion 510 within the evaporation chamber (B) 509, an Al—Li alloy film (an alloy film of aluminum and lithium) is deposited as the conducting film which becomes the EL element cathode.

Note that it is also possible to co-evaporate an element residing in group 1 or group 2 of the periodic table, and aluminum. Co-evaporation refers to evaporation in which cells are heated at the same time, and different materials are combined at the stage of film formation.

Next, reference numeral 511 denotes a sealing chamber (also referred to as an enclosing chamber or a globe box), and is connected to the load chamber 504 through a gate 500*e*. A process for final hermetic sealing of the EL element is performed in the sealing chamber 511. This process is one in which the formed EL element is protected from oxygen and moisture, and a means for mechanically sealing by a sealing material, or a means for sealing by a thermally hardened resin or an ultraviolet light hardened resin is used.

Glass, ceramic, plastic, and metal can be used as the sealing material, but when light is irradiated onto the sealing material side, the material must have transparency. Further, when the sealing material and substrate on which the above EL element is formed are joined using a thermal hardened resin or an ultraviolet light hardened resin, the resin is hardened by heat treatment or by ultraviolet light irradiation processing, forming an airtight space. It is also effective to forma drying agent, typically barium oxide, within the airtight space.

Further, it is also possible to fill the space between the sealing material and the substrate on which the EL element is formed by a thermal hardened resin or an ultraviolet light hardened resin. In this case, it is effective to add a drying agent, typically barium oxide, within the thermal hardened resin or the ultraviolet light hardened resin.

A mechanism for irradiating ultraviolet light (hereafter referred to as an ultraviolet light irradiation mechanism) 512 is formed on an internal portion of the sealing chamber 511, and the film formation apparatus shown in FIG. 5 has a structure in which an ultraviolet light hardened resin is hardened by ultraviolet light emitted from the ultraviolet light irradiation mechanism 512. Further, it is possible to reduce the pressure of the inside portion of the sealing chamber 511 by attaching an evacuation pump. When mechanically performing the above sealing processes by using robot operation, oxygen and moisture can be prevented from mixing in by performing the processes under reduced pressure. Furthermore, it is also possible to pressurize the inside portion of the sealing chamber 511. In this case pressurization is performed by a high purity nitrogen gas or noble gas while purging, and an incursion of a contaminant such as oxygen from the atmosphere is prevented.

Next, a delivery chamber (a pass box) 513 is connected to the sealing chamber 511. A conveyor mechanism (B) 514 is formed in the delivery chamber 513, and the substrate on which the EL element has been completely sealed in the sealing chamber 511 is conveyed to the delivery chamber 513. It is possible to also make the delivery chamber 513 reduced pressure by attaching an evacuation pump. The delivery chamber 513 is equipment used so that the sealing chamber 511 is not directly exposed to the atmosphere, and the substrate is removed from here.

It thus becomes possible to manufacture an EL display device having high reliability by using the film formation apparatus shown in FIG. 5 because processing can be finished up through the point, without exposure to the atmosphere, at which the EL element is completely sealed into an airtight space.

Embodiment 2

Figure 6:
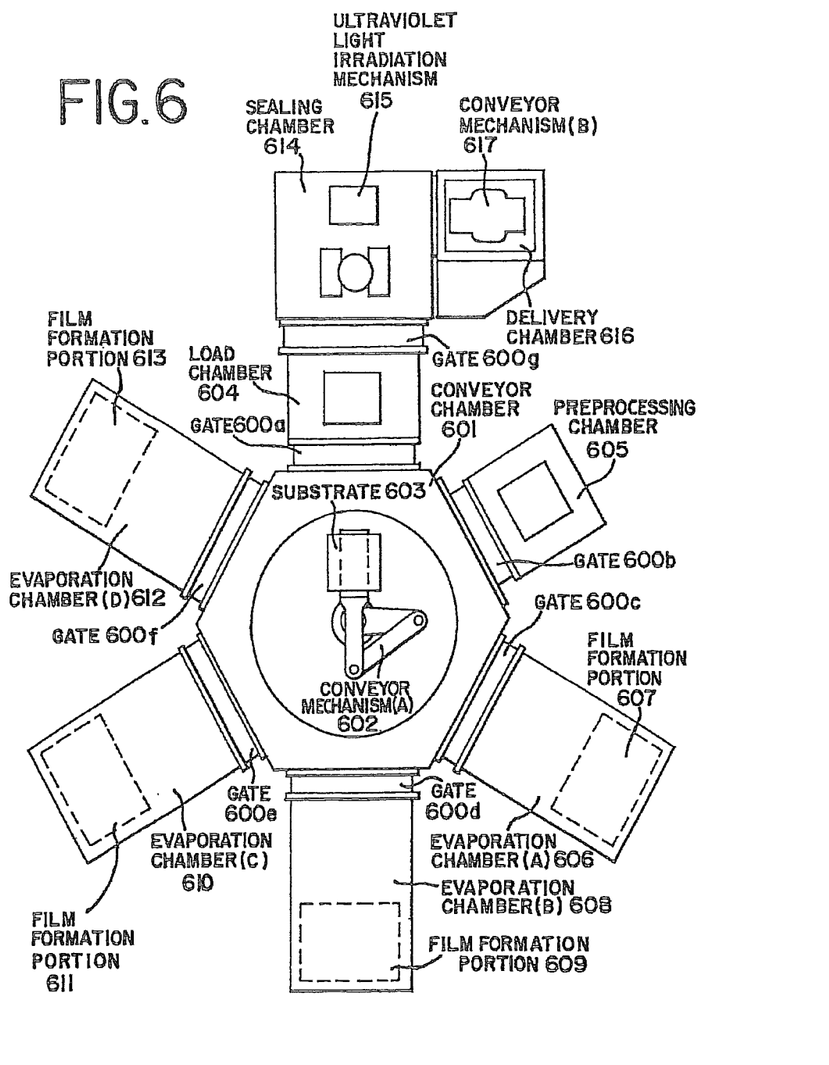
FIG. 6 is a diagram showing a structure of a film formation apparatus.

A case of using a film formation apparatus of the present invention in a multi-chamber method (also referred to as a cluster tool method) is explained using FIG. 6. Reference numeral 601 denotes a conveyor chamber in FIG. 6. A conveyor mechanism (A) 602 is prepared in the conveyor chamber 601, and conveyance of a substrate 603 is performed. The conveyor chamber 601 has a reduced pressure atmosphere, and is connected to each processing chamber by a gate. Delivery of the substrate to each processing chamber is performed by the conveyor mechanism (A) 602 when the gates are open. Further, it is possible to use an evacuation pump such as an oil-sealed rotary pump, a mechanical booster pump, a turbo-molecular pump, and a cryo-pump in lowering the pressure of the conveyor chamber 601, but a cryo-pump, which is effective in removing moisture, is preferable.

An explanation regarding each processing chamber is made below. Note that the conveyor chamber 601 has a reduced pressure atmosphere, and therefore an evacuation pump (not shown in the figure) is prepared in each processing chamber directly connected to the conveyor chamber 601. The above stated oil-sealed rotary pump, mechanical booster pump, turbo-molecular pump, and cryo-pump is used as the evacuation pump.

First, reference numeral 604 denotes a load chamber for performing substrate setting, and it is also called an unload chamber. The load chamber 604 is connected to the conveyor chamber 601 by a gate 600*a*, and a carrier (not shown in the figure) on which the substrate 603 is set is arranged here. Note that the load chamber 604 may also be separated into a substrate loading chamber and a substrate unloading chamber. Further, the above evacuation pump and a purge line for introducing high purity nitrogen gas or noble gas are prepared for the load chamber 604.

Next, reference numeral 605 denotes a preprocessing chamber for processing a surface of an anode or a cathode of an EL element (in Embodiment 2, an anode), and the processing chamber 605 is connected to the conveyor chamber 601 by a gate 600*b*. The preprocessing chamber can be changed variously depending upon the manufacturing process of the EL element, and in Embodiment 2 heat treatment of the surface of the anode made from the transparent conducting film can be performed at between 100 and 120° C. in oxygen while irradiating ultraviolet light. This type of pre-process is effective when processing the anode surface of the EL element.

Next, reference numeral 606 denotes an evaporation chamber for film deposition of an organic EL material by evaporation, and is referred to as an evaporation chamber (A). The evaporation chamber (A) 606 is connected to the conveyor chamber 601 through a gate 600*c*. In Embodiment 2 an evaporation chamber having the structure shown in FIGS. 2A and 2B is used as the evaporation chamber (A) 606.

In a film formation portion 607 of the evaporation chamber (A) 606, a hole injecting layer is first deposited over the entire substrate surface, then a light emitting layer for emitting red color light is formed. Accordingly, an evaporation source and a shadow mask are provided with two types of each corresponding to the organic material to be the hole injecting layer and the red light emitting layer, and are structured to be capable of switching. Note that known materials may be used as the hole injecting layer, and the red color light emitting layer.

Next, reference numeral 608 denotes an evaporation chamber for film formation of an organic EL material by evaporation, and is referred to as an evaporation chamber (B). The evaporation chamber (B) 608 is connected to the conveyor chamber 601 through a gate 600d. In Embodiment 2, an evaporation chamber with the structure shown in FIGS. 2A and 2B is used as the evaporation chamber (B) 608. A light emitting layer for emitting green color light is deposited in a film formation portion 609 within the evaporation chamber (B) 608 in Embodiment 2. Note that a known material may be used as the light emitting layer for emitting green color light in Embodiment 2.

Next, reference numeral 610 denotes an evaporation chamber for film formation of an organic EL material by evaporation, and is referred to as an evaporation chamber (C). The evaporation chamber (C) 610 is connected to the conveyor chamber 601 through a gate 600e. In Embodiment 2, an evaporation chamber with the structure shown in FIGS. 2A and 2B is used as the evaporation chamber (C) 610. A light emitting layer for emitting blue color light is deposited in a film formation portion 611 within the evaporation chamber (C) 610 in Embodiment 2. Note that a known material may be used as the light emitting layer for emitting blue color light in Embodiment 2.

Next, reference numeral 612 denotes an evaporation chamber for film formation of a conducting film, which becomes an anode or a cathode of the EL element, by evaporation (a metallic film which becomes a cathode is used in Embodiment 2), and is referred to as an evaporation chamber (D). The evaporation chamber (D) 612 is connected to the conveyor chamber 601 through a gate 600f. An evaporation chamber having the structure shown in FIGS. 2A and 2B is used as the evaporation chamber (D) 612 in Embodiment 2. In a film formation portion 613 within the evaporation chamber (D) 612, an Al—Li alloy film (an alloy film of aluminum and lithium) is deposited as the conducting film which becomes the EL element cathode. Note that it is also possible to co-evaporate an element residing in group 1 or group 2 of the periodic table, and aluminum.

Next, reference numeral 614 denotes a sealing chamber, and is connected to the load chamber 604 through a gate 600g. For explanation of the sealing chamber 614 refer to Embodiment 1. Further, an ultraviolet light irradiation mechanism 615 is formed in the inside portion of the sealing chamber 614, similar to Embodiment 1. In addition, a delivery chamber 616 is connected to the sealing chamber 615. A conveyor mechanism (B) 617 is formed in the delivery chamber 616, and the substrate, on which the EL element has been completely sealed in the sealing chamber 614, is conveyed to the delivery chamber 616. Embodiment 1 may be referred to for an explanation of the delivery chamber 616.

It thus becomes possible to manufacture an EL display device having high reliability by using the film formation apparatus shown in FIG. 6 because processing can be finished up through the point, without exposure to the atmosphere, at which the EL element is completely sealed into an airtight space.

Embodiment 3

Figure 7:
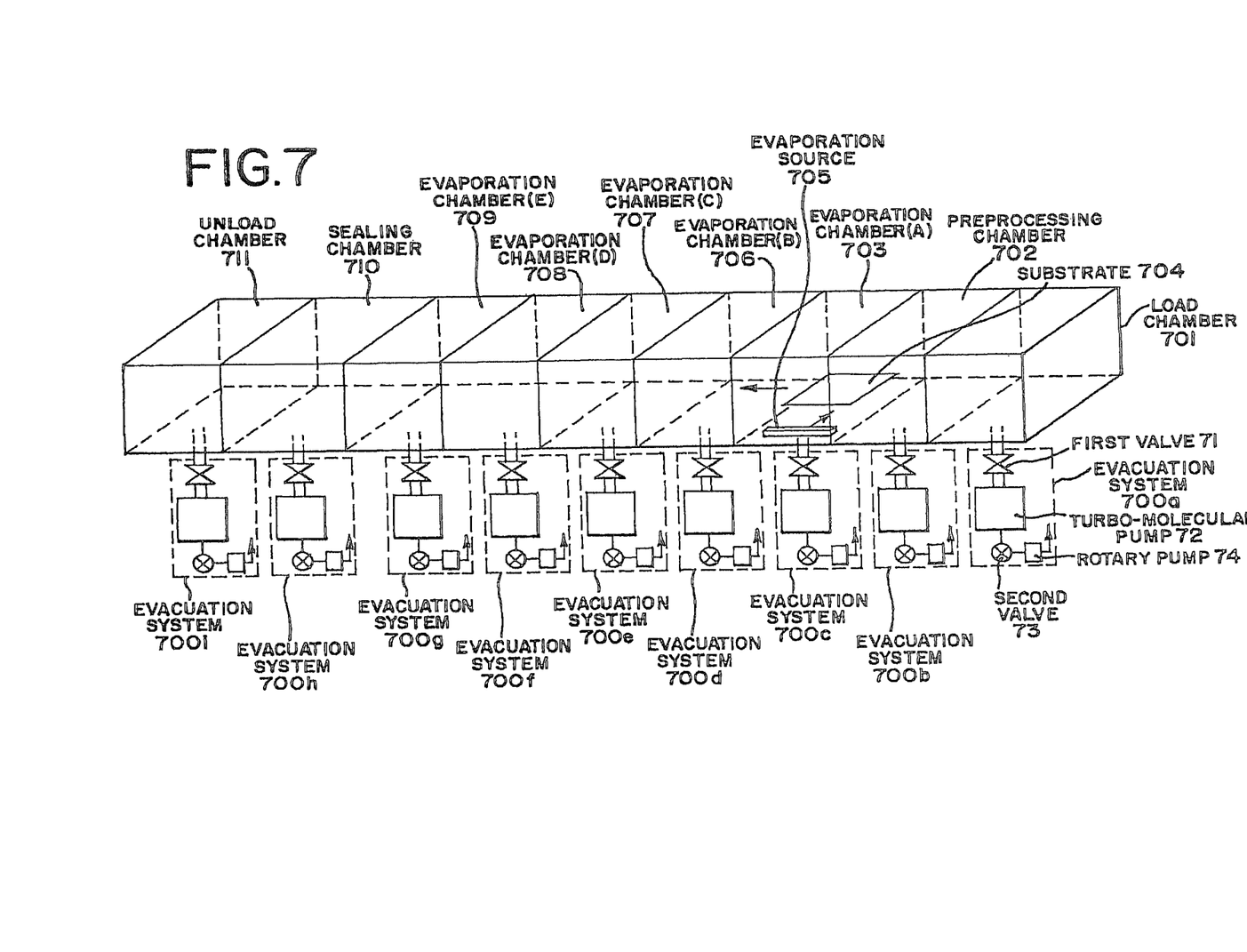
FIG. 7 is a diagram showing a structure of a film formation apparatus.

A case of using a film formation apparatus of the present invention in an in-line method is explained using FIG. 7. Reference numeral 701 denotes a load chamber in FIG. 7, and conveyance of a substrate is performed here. An evacuation system 700a is prepared in the load chamber 701, and the evacuation system 700a has a structure containing a first valve 71, a turbo-molecular pump 72, a second valve 73, and a rotary pump (oil-sealed rotary pump) 74.

The first valve 71 is a main valve, and there are cases when it also combines a conductance valve, and there are also cases when a butterfly valve is used. The second valve 73 is a fore valve, and the second valve 73 is opened first, and the load chamber 701 is roughly reduced in pressure by the rotary pump 74. The first valve 71 is opened next, and the pressure is reduced by the turbo-molecular pump 72 until a high vacuum is reached. Note that it is possible to use a mechanical booster pump or a cryo-pump as a substitute for the turbo-molecular pump, but the cryo-pump is particularly effective in removing moisture.

Next, reference numeral 702 denotes a preprocessing chamber for processing a surface of an anode or a cathode of an EL element (in Embodiment 3, an anode), and the preprocessing chamber 702 is prepared with an evacuation system 700b. Further, it is hermetically sealed off from the load chamber 701 by a gate not shown in the figure. The preprocessing chamber 702 can be changed variously depending upon the manufacturing process of the EL element, and in Embodiment 3 heat treatment of the surface of the anode made from the transparent conducting film can be performed at between 100 and 120° C. in oxygen while irradiating ultraviolet light.

Next, reference numeral 703 denotes an evaporation chamber for film deposition of an organic EL material by evaporation, and is referred to as an evaporation chamber (A). Further, it is hermetically sealed off from the load chamber 702 by a gate not shown in the figure. The evaporation chamber (A) 703 is prepared with an evacuation system 700c. In Embodiment 3 an evaporation chamber having the structure shown in FIGS. 2A and 2B is used as the evaporation chamber (A) 703.

A substrate 704 conveyed to the evaporation chamber (A) 703, and an evaporation source 705 prepared in the evaporation chamber (A) 703, are moved in the direction of the arrows, respectively, and film formation is performed. Note that FIGS. 2A and 2B may be referred to regarding detailed operation of the evaporation chamber (A) 703. A hole injecting layer is deposited in the evaporation chamber (A) 703 in Embodiment 3. A known material may be used as the hole injecting layer.

Next, reference numeral 706 denotes an evaporation chamber for film formation of an organic EL material by evaporation, and is referred to as an evaporation chamber (B). The evaporation chamber (B) 706 is prepared with an evacuation system 700d. Further, it is hermetically sealed off from the evacuation chamber (A) 703 by a gate not shown in the figure. An evaporation chamber having the structure shown in FIGS. 2A and 2B is formed as the evaporation chamber (B) 706 in Embodiment 3. The explanation of FIGS. 2A and 2B may therefore be referred to regarding detailed operation of the evaporation chamber (B) 706. Further, a light emitting layer for emitting red color light is deposited in the evaporation chamber (B) 706. A known material may be used as the light emitting layer which emits red color light.

Next, reference numeral 707 denotes an evaporation chamber for film formation of an organic EL material by evaporation, and is referred to as an evaporation chamber (C). The evaporation chamber (C) 707 is prepared with an evacuation system 700e. Further, it is hermetically sealed off from the evacuation chamber (B) 706 by a gate not shown in the figure. An evaporation chamber having the structure shown in FIGS. 2A and 2B is formed as the evaporation chamber (C) 707 in Embodiment 3. The explanation of FIGS. 2A and 2B may therefore be referred to regarding detailed operation of the evaporation chamber (C) 707. Further, a light emitting layer for emitting green color light is deposited in the evaporation chamber (C) 707. A known material may be used as the light emitting layer which emits green color light.

Next, reference numeral 708 denotes an evaporation chamber for film formation of an organic EL element by evaporation, and is referred to as an evaporation chamber (D). The evaporation chamber (D) 708 is prepared with an evacuation system 700f. Further, it is hermetically sealed off from the evaporation chamber (C) 707 by a gate not shown in the figure. An evaporation chamber having the structure shown in FIGS. 2A and 2B is formed as the evaporation chamber (D) 708 in Embodiment 3. The explanation of FIGS. 2A and 2B may therefore be referred to regarding detailed operation of the evaporation chamber (D) 708. Further, a light emitting layer for emitting blue color light is deposited in the evaporation chamber (D) 708. A known material may be used as the light emitting layer which emits blue color light.

Next, reference numeral 709 denotes an evaporation chamber for film formation of a conducting film (a metallic film which becomes a cathode is used in Embodiment 3), which becomes an anode or a cathode of the EL element, by evaporation, and is referred to as an evaporation chamber (E). The evaporation chamber (E) 709 is prepared with an evacuation system 700g. Further, it is hermetically sealed off from the evaporation chamber (D) 708 by a gate not shown in the figure. An evaporation chamber having the structure shown in FIGS. 2A and 2B is formed as the evaporation chamber (E) 709 in Embodiment 3. The explanation of FIGS. 2A and 2B may therefore be referred to regarding detailed operation of the evaporation chamber (E) 709.

An Al—Li alloy film (an alloy film of aluminum and lithium) is deposited in the evaporation chamber (E) 709 as the conducting film which becomes the EL element cathode. Note that it is also possible to co-evaporate an element residing in group 1 or group 2 of the periodic table, and aluminum.

Next, reference numeral 710 denotes a sealing chamber, and it is prepared with an evacuation system 700h. Further, it is hermetically sealed off from the evacuation chamber (E) 709 by a gate not shown in the figure. Embodiment 1 may be referred to regarding an explanation of the sealing chamber 710. Furthermore, an ultraviolet light irradiation mechanism is provided on the inside portion of the sealing chamber 710, similar to Embodiment 1.

Finally, reference numeral 711 denotes an unload chamber, and it is prepared with an evacuation system 700i. The substrate on which the EL element is formed is removed from here.

It thus becomes possible to manufacture an EL display device having high reliability by using the film formation apparatus shown in FIG. 7 because processing can be finished up through the point, without exposure to the atmosphere, at which the EL element is completely sealed into an airtight space. An EL display device can furthermore be manufactured at a high throughput in accordance with the in-line method.

Embodiment 4

Figure 8:
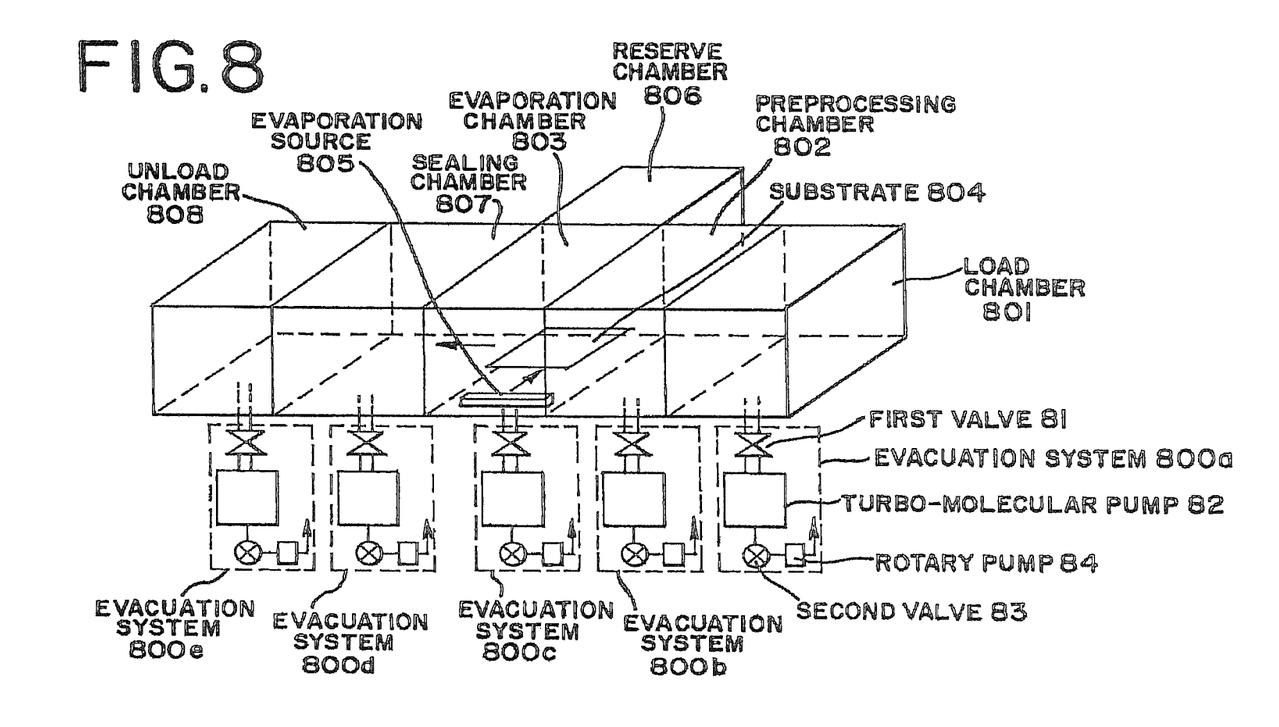
FIG. 8 is a diagram showing a structure of a film formation apparatus.

A case of using a film formation apparatus of the present invention in an in-line method is explained using FIG. 8. Reference numeral 801 denotes a load chamber in FIG. 8, and conveyance of a substrate is performed here. An evacuation system 800a is prepared in the load chamber 801, and the evacuation system 800a has a structure containing a first valve 81, a turbo-molecular pump 82, a second valve 83, and a rotary pump (oil-sealed rotary pump) 84.

Next, reference numeral 802 denotes a preprocessing chamber for processing a surface of an anode or a cathode of an EL element (in Embodiment 4, an anode), and the preprocessing chamber 802 is prepared with an evacuation system 800b. Further, it is hermetically sealed off from the load chamber 801 by a gate not shown in the figure. The preprocessing chamber 802 can be changed variously depending upon the manufacturing process of the EL element, and in Embodiment 4 heat treatment of the surface of the anode made from the transparent conducting film can be performed at between 100 and 120° C. in oxygen while irradiating ultraviolet light.

Next, reference numeral 803 denotes an evaporation chamber for film deposition of an organic EL material by evaporation, and the evaporation chamber 803 is prepared with an evacuation system 800c. In Embodiment 4 an evaporation chamber having the structure shown in FIGS. 2A and 2B is used as the evaporation chamber 803. A substrate 804 conveyed to the evaporation chamber 803, and an evaporation source 805 prepared in the evaporation chamber 803, are moved in the direction of the arrows, respectively, and film formation is performed.

In Embodiment 4, it is preferable to switch the evaporation source 803 or the shadow mask (not shown) at the time of film deposition in the evaporation chamber 803 in order to form a conductive film to be hole injection layer, a red light emitting layer, a green light emitting layer, a blue light emitting layer or a cathode. In Embodiment 4, the evaporation chamber 803 is connected with a reserve chamber 806, in which the evaporation source and the shadow mask are stored to switch appropriately.

Next, reference numeral 807 denotes a sealing chamber, and it is prepared with an evacuation system 800d. Further, it is hermetically sealed off from the evacuation chamber 803 by a gate not shown in the figure. Embodiment 1 may be referred to regarding an explanation of the sealing chamber 807. Furthermore, an ultraviolet light irradiation mechanism (not shown in the figure) is provided on the inside portion of the sealing chamber 807, similar to Embodiment 1.

Finally, reference numeral 808 denotes an unload chamber, and it is prepared with an evacuation system 800e. The substrate on which the EL element is formed is removed from here.

It thus becomes possible to manufacture an EL display device having high reliability by using the film formation apparatus shown in FIG. 8 because processing can be finished up through to the point, at which the EL element is completely sealed into an airtight space without exposure to the atmosphere. An EL display device can furthermore be manufactured at a high throughput in accordance with the in-line method.

By using the film formation apparatus of the present invention, it becomes possible to perform film formation, at high throughput, of a thin film having high uniformity in its film thickness distribution on the substrate surface.

What is claimed is:

1. A method of manufacturing a light emitting device comprising the steps of:
    disposing an evaporation cell in a chamber, the evaporation cell having a length of 300 mm or greater in a longitudinal direction of the evaporation cell;
    disposing a substrate over the evaporation cell in the chamber;
    heating the evaporation cell to evaporate an organic material contained in the evaporation cell and to form a light emitting layer over the substrate; and
    changing a relative position of the substrate with respect to the evaporation cell in a direction orthogonal to the longitudinal direction of the evaporation cell in the chamber while evaporating the organic material,
    wherein the evaporation of the organic material is initiated by heating the evaporation cell.

2. The method according to claim 1 wherein the evaporation cell is moved in the step of changing the relative position of the substrate.

3. The method according to claim 1 wherein the light emitting device is a display device.

4. The method according to claim 1 wherein the evaporation cell is longer than an edge of the substrate in the longitudinal direction.

5. A method of manufacturing a light emitting device comprising the steps of:
    disposing an evaporation cell in a chamber, the evaporation cell having a length of 300 mm or greater in a longitudinal direction of the evaporation cell;
    disposing a substrate over the evaporation cell with a shadow mask interposed therebetween in the chamber;
    heating the evaporation cell to evaporate an organic material contained in the evaporation cell toward the substrate through the shadow mask and to form a light emitting layer over the substrate; and
    changing a relative position of the substrate with respect to the evaporation cell in a direction orthogonal to the longitudinal direction of the evaporation cell in the chamber while evaporating the organic material,
    wherein the evaporation of the organic material is initiated by heating the evaporation cell.

6. The method according to claim 5 wherein the evaporation cell is moved in the step of changing the relative position of the substrate.

7. The method according to claim 5 wherein the light emitting device is a display device.

8. The method according to claim 5 wherein the evaporation cell is longer than an edge of the substrate in the longitudinal direction.

* * * * *